(12) United States Patent
Dubhashi et al.

(10) Patent No.: US 6,819,095 B1
(45) Date of Patent: Nov. 16, 2004

(54) POWER SEMICONDUCTOR DEVICE ASSEMBLY WITH INTEGRATED CURRENT SENSING AND CONTROL

(75) Inventors: Ajit Dubhashi, Redondo Beach, CA (US); Shahin Maloyan, Northridge, CA (US); Joshua Polack, Glendale, CA (US)

(73) Assignee: International Rectifier Corporation, El Segundo, CA (US)

( * ) Notice: Subject to any disclaimer, the term of this patent is extended or adjusted under 35 U.S.C. 154(b) by 339 days.

(21) Appl. No.: 09/660,813

(22) Filed: Sep. 13, 2000

Related U.S. Application Data

(60) Provisional application No. 60/154,283, filed on Sep. 16, 1999.

(51) Int. Cl.[7] .............................................. G01R 31/00
(52) U.S. Cl. ................................ 324/117 H; 324/117 R
(58) Field of Search ........................ 324/117 R, 117 H, 324/251–252, 126–127; 338/32 H

(56) References Cited

U.S. PATENT DOCUMENTS

| | | | | |
|---|---|---|---|---|
| 5,041,780 A | * | 8/1991 | Rippel | 324/117 H |
| 5,049,809 A | * | 9/1991 | Wakatsuki et al. | 324/117 R |
| 5,399,965 A | * | 3/1995 | Heberle | 324/117 H |
| 5,436,557 A | * | 7/1995 | Erickson | 324/117 H |
| 5,450,000 A | * | 9/1995 | Olsen | 323/222 |
| 5,570,034 A | * | 10/1996 | Needham et al. | 324/763 |
| 5,627,398 A | * | 5/1997 | Zlebir et al. | 257/427 |
| 6,426,617 B1 | * | 7/2002 | Haensgen et al. | 324/117 H |

* cited by examiner

*Primary Examiner*—Vinh P. Nguyen
(74) *Attorney, Agent, or Firm*—Ostrolenk, Faber, Gerb & Soffen, LLP

(57) ABSTRACT

A semiconductor module has a conductive heat sink base which receives a power semiconductor and a printed circuit board mounted above the heat sink and carrying control circuits for the power semiconductor. A rigid L-shaped terminal connected to one electrode of the power semiconductor is mounted on the base and extends upward and adjacent an edge of the printed circuit board. A Hall sensor is mounted on the printed circuit board and is disposed in and intercepts the magnetic field produced by current in the terminal. Magnetic bodies are mounted on opposite sides of the Hall element to concentrate the magnetic field through the Hall sensor.

15 Claims, 2 Drawing Sheets

POWER SEMICONDUCTOR DEVICE ASSEMBLY WITH INTEGRATED CURRENT SENSING AND CONTROL

FIELD OF THE INVENTION

This invention relates to a current sensing structure and more specifically relates to a novel current sensing structure for power semiconductor device module assemblies. This application claims the benefit of provisional application Ser. No. 60/154,283 filed Sep. 16, 1999.

BACKGROUND OF THE INVENTION

Most power electronic applications require knowledge of the current in the system, either in the load or in the switches. This is usually used to protect the system, the power conversion devices or to enhance system performance. Current monitoring is done in many ways such as by current transformers ("CTs"), shunt resistors, current sensing devices and DC current probes based on Hall effect devices which are coupled with gapped core and coil assemblies. Current transformers cannot be used in applications that require sensing of low frequency currents. Shunt resistors are limited in their application range to a maximum of a few tens of amperes. DC current probes based on the Hall effect are expensive and add cost to the system assembly.

BRIEF DESCRIPTION OF THE INVENTION

In accordance with the invention, the driver printed circuit board ("PCB") of a power module carries a current sensor such as commercially available Hall effect device (without magnetics) disposed at an edge of the board and positioned in the magnetic field that is created by the conductors carrying the current to and from the module. Magnetic bars or bodies may also be fastened to the board to focus or increase flux in the current sensor.

Some of the features of the present invention are:

1. Including a Hall effect or other current sensing assembly such as magnetostrictive devices in the module and placing it in a position to detect the field.
2. Ensuring a way to place the current sensor device in an accurate orientation with respect to the current carrying conductor.
3. Using the output of the device to trip a comparator to protect the switches or system.
4. Making the output of the device available to a controller for improving system performance.
5. In cases where the current is not strong enough to create the requisite magnetic field, adding appropriate bars of ferrite, iron or similar ferro magnetic material which allows an increase in the flux density through the sensor for a given current.
6. Bending the current carrying conductor whose current is to be measured in a particular direction to increase or decrease the amount of flux in the sensing device.

DETAILED DESCRIPTION OF THE DRAWINGS

Figure 1:
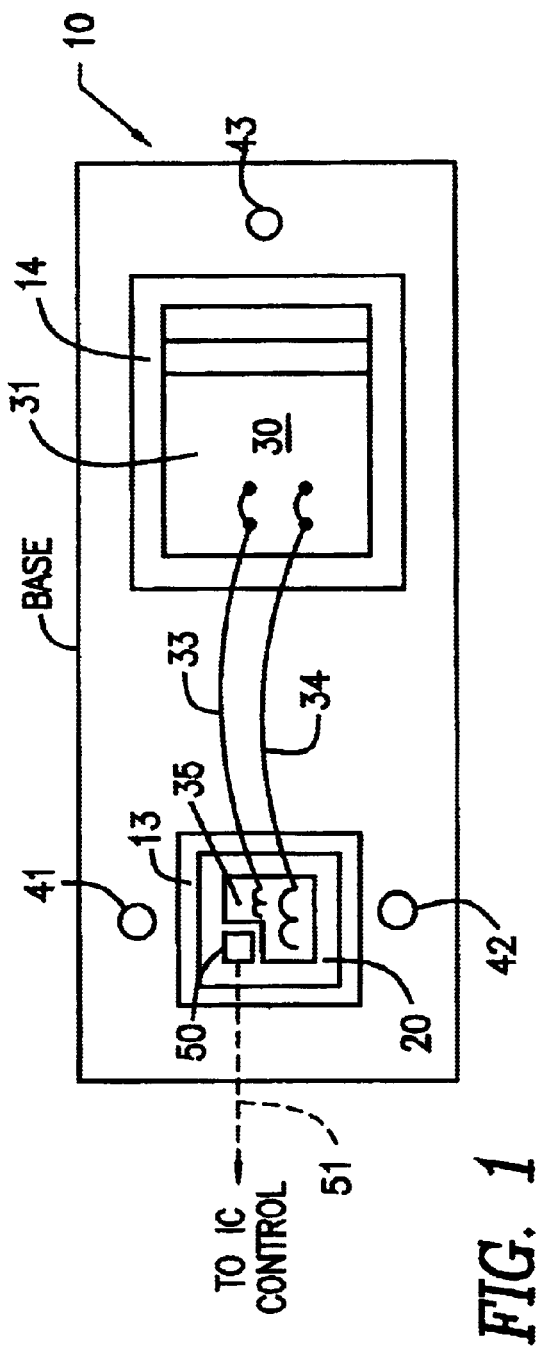
FIG. 1 is a view of the base of the assembly of the invention and is a cross-section of FIG. 3 taken across section lines 1—1 in FIG. 3.
Figure 3:
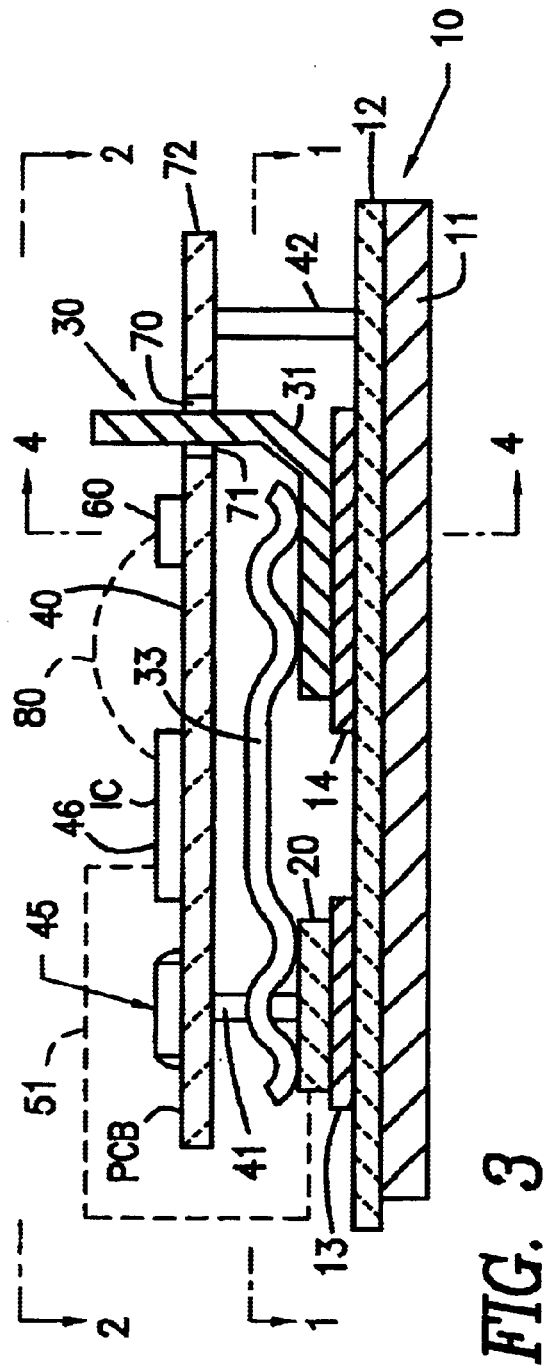
FIG. 3 is a cross-section of FIG. 2 taken across section line 3—3 in FIG. 2.
Figure 4:
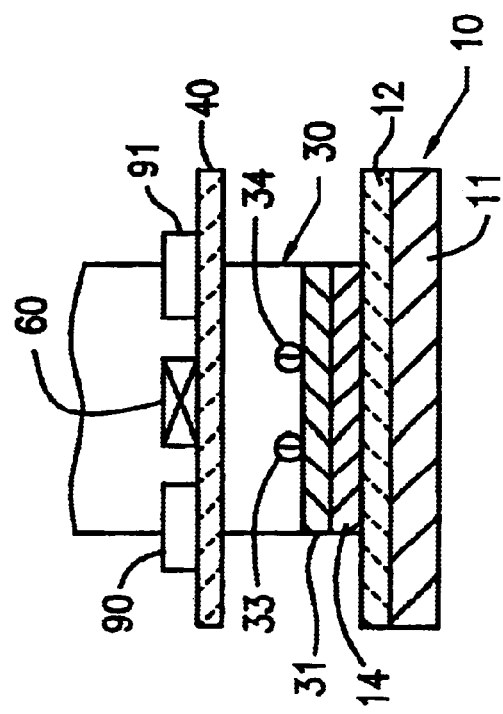
FIG. 4 is a cross-section of FIG. 3 taken across section line 4—4 in FIG. 3.

Referring first to FIG. 1, there is shown a heat sink base plate 10 which may be of any desired metal 11 having an insulation top layer 12 (FIGS. 3 and 4) and conductive copper pad areas 13 and 14. Any desired pattern of pads, depending on the desired circuit arrangement of power devices thereon can be used. Thus in FIGS. 1 and 2, a single power semiconductor device 20, shown as a power MOSFET. However, the power device could be any other MOS-gated device such as an IGBT, or any other power semiconductor device such as a bipolar transistor, thyristor or the like. Further, any desired number of devices can be used.

Device 20 has its bottom power electrode (drain) secured to conductive pad 13 as by solder, or conductive epoxy or the like. The source may be suitably connected with a current carrying terminal conductor 30, which is a rigid, L-shaped thin, flat and copper bar which has its lower leg 31 soldered or connected by a conductive epoxy to pad 14 and is suitably arranged so that it carries the source to drain current of device 20. A plurality of parallel wire bonds 33, 34 connect the source electrode 35 (FIG. 1) of MOSFET 20 to the upright leg 31 of current conductor 30.

In order to control the conduction of MOSFET 20 as desired, a control circuit is carried on a conventional thin flat printed circuit board 40 which is mounted above and parallel to base 10. Suitable insulation support posts 41, 42 and 43 may extend between base 10 and board 40 for this support function. Board 40 may carry any desired control circuit 45 and a control integrated circuit chip 46 (FIGS. 2 and 3) to control MOSFET 20. Thus, the MOSFET gate electrode 50 (FIG. 1) is coupled to the control circuit as shown by the dotted line 51 in FIGS. 1 and 3.

To this point, the structure described is generic to many known types of power semiconductor device modules. In accordance with the invention, a magnetic field responsive transducer 60 is mounted as by adhesive or the like or solder on the board 40 adjacent an end edge of the board. Thus, in FIGS. 2 and 3, the board has a thin elongated slit 70 thereon which defines an interior end edge 71. (The edge could also have been on the outermost board edge 72 if desired). The rigid current conductor 30 then extends adjacent to edge 71 in its upward extending path to the exterior of the module. Preferably, the vertical portion of conductor 30 is perpendicular to the plane of board 40, but it can be at any angle thereto greater than zero.

Figure 2:
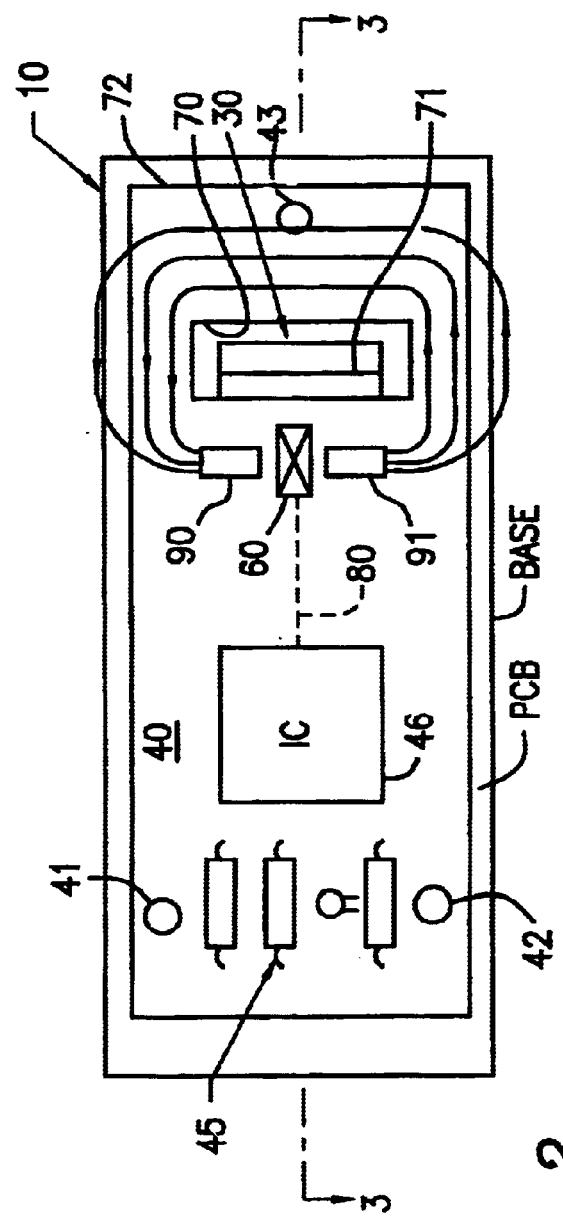
FIG. 2 is a view of the top of the printed circuit board of the invention and is a view of FIG. 3 taken across section lines 2—2 in FIG. 3.

By placing the sensor 60, which is preferably a Hall effect element or a magneto resistive device (MRD), adjacent the edge 71, the Hall element will be in the path of and will intercept the magnetic field lines produced by the current in conductor 30, as shown in FIG. 2. Details of the structure of the Hall effect element and MRD, including input and output terminals and biases are well known and are not described herein. The Hall element 60, or other sensor, will then produce an output voltage proportional to the field and thus to the current in conductor 30. This output signal can then be coupled back to the IC 46, as shown by dotted lines 80 in FIGS. 2 and 3 to effect a desired control of MOSFET 20 in response to its source to drain current. In addition to the described physical relative locations of the sensing device and the current carrying conductor, there could be other locations.

Bars 90 and 91 of a magnetic material such as ferrite, or ferromagnetic material may be added to increase the flux in the sensing device area. These bars may be used to permit accurate measurement of lower currents, for example 25 to 100 amperes. When currents in excess of 400 amperes are to be measured, the bars 90 and 91 may not necessary based on the sensitivity of the sense.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A current sensing structure for a power semiconductor device, said semiconductor device having at least one power electrode and a control electrode; said power electrode connected to an elongated conductive terminal electrode, said current sensing structure including a printed circuit board having a control circuit thereon which is connected to said control electrode to control current flow in said power semiconductor device; said printed circuit board being spaced from said semiconductor device; said printed circuit board having an edge portion; said printed circuit board having a magnetic field responsive transducer thereon disposed adjacent said edge portion, said transducer producing an output signal which is related to a magnetic field which is intercepted by said transducer; said elongated terminal conductor having a portion thereof which is disposed adjacent said edge portion and is at an angle greater than zero degrees with respect thereto, whereby the magnetic field produced by current through said elongated terminal conductor is intercepted by said magnetic field responsive transducer and produces an output therefrom which is related to the current in said elongated terminal conductor.

2. The structure of claim 1, wherein said transducer is a Hall sensor.

3. The structure of claim 2, wherein said elongated terminal conductor terminal is a rigid conductor.

4. The structure of claim 3, wherein said elongated terminal conductor is a flat relatively thin conductor.

5. The structure of claim 3, wherein said elongated terminal conductor extends perpendicular to the plane of said printed circuit board.

6. The structure of claim 1, which further includes a flat elongated heat sink; said semiconductor device having a bottom electrode secured to said base; said printed circuit board being mounted atop said base and spaced therefrom and extending parallel thereto.

7. The structure of claim 6, wherein said elongated terminal conductor is a flat relatively thin conductor.

8. The structure of claim 7, wherein said elongated terminal conductor is an L-shaped bracket having its bottom surface mounted on said base.

9. The structure of claim 8, wherein said elongated terminal conductor is a rigid conductor.

10. The structure of claim 1, wherein said printed circuit board has an elongated slot therein; said edge comprising an interior edge of said slot; said elongated terminal conductor extending through said slot.

11. The structure of claim 1, which further includes at least one magnetic body disposed adjacent said transducer and in line with the magnetic field path of said elongated terminal conductor to increase the magnetic flux intercepted by said transducer.

12. The structure of claim 11, wherein said transducer is a Hall sensor.

13. The structure of claim 12, wherein said elongated terminal conductor is a flat relatively thin conductor.

14. The structure of claim 13, which further includes a flat elongated heat sink; said semiconductor device having a bottom electrode secured to said base; said printed circuit board being mounted atop said base and spaced therefrom and extending parallel thereto.

15. The structure of claim 14, wherein said printed circuit board has an elongate slot therein; said edge comprising an interior edge of said slot; said elongated terminal conductor extending through said slot.

* * * * *